(12) United States Patent
Himel et al.

(10) Patent No.: US 7,916,390 B2
(45) Date of Patent: Mar. 29, 2011

(54) MONOLITHIC POLARIZATION CONTROLLED ANGLE DIFFUSERS, ASSOCIATED METHODS AND LITHOGRAPHIC SYSTEMS INCORPORATING CONTROLLED ANGLE DIFFUSERS

(75) Inventors: Marc D. Himel, Cornelius, NC (US); Alan D. Kathman, Charlotte, NC (US)

(73) Assignee: Tessera North Carolina, Inc., Charlotte, NC (US)

( * ) Notice: Subject to any disclaimer, the term of this patent is extended or adjusted under 35 U.S.C. 154(b) by 154 days.

(21) Appl. No.: 11/711,854

(22) Filed: Feb. 28, 2007

(65) Prior Publication Data

US 2007/0211337 A1    Sep. 13, 2007

Related U.S. Application Data

(63) Continuation-in-part of application No. PCT/US2005/030780, filed on Aug. 30, 2005.

(60) Provisional application No. 60/714,506, filed on Aug. 31, 2004.

(51) Int. Cl.
*G02B 5/30* (2006.01)

(52) U.S. Cl. .................. 359/487; 359/599; 359/601

(58) Field of Classification Search .................. None
See application file for complete search history.

(56) References Cited

U.S. PATENT DOCUMENTS

| | | | |
|---|---|---|---|
| 5,559,583 A | 9/1996 | Tanabe et al. | |
| 5,850,300 A | 12/1998 | Kathman et al. | |
| 5,914,811 A * | 6/1999 | Chen et al. | 359/495 |
| 6,211,944 B1 | 4/2001 | Shiraishi | |
| 6,259,561 B1 * | 7/2001 | George et al. | 359/566 |
| 6,285,443 B1 | 9/2001 | Wangler et al. | |
| 7,038,763 B2 | 5/2006 | Mulder et al. | |
| 2008/0192223 A1 | 8/2008 | Volkenandt et al. | |

FOREIGN PATENT DOCUMENTS

| | | |
|---|---|---|
| CN | 1 461 974 A | 12/2003 |
| EP | 1 341 026 | 9/2003 |
| EP | 1 367 446 | 12/2003 |

OTHER PUBLICATIONS

Yu, Wanji, et al., "Synthesis of polarization-selective optical components with multi-layer subwavelength structures", Proceedings of the SPIE, SPIE, Bellingham, WA, US, vol. 5183, No. 1, pp. 184-191 (2003).

* cited by examiner

*Primary Examiner* — Lee Fineman

(74) *Attorney, Agent, or Firm* — Lee & Morse, P.C.

(57) ABSTRACT

A monolithic polarization controlled angle diffuser includes a system having a first surface and a second surface, a controlled angle diffuser pattern for providing an angular distribution at an illumination plane, the controlled angle diffuser pattern being on one of the first and second surfaces of the substrate, and a polarizing pattern on one of the first and second surfaces of the substrate. The controlled angle diffuser pattern includes at least two controlled angle diffuser elements. Each controlled angle diffuser element outputs different angular distributions. The polarizing pattern includes at least two polarizing elements. Each polarizing element corresponds to a respective controlled angle diffuser element. The at least two polarizing elements output polarizations are rotated with respect to one another.

27 Claims, 6 Drawing Sheets

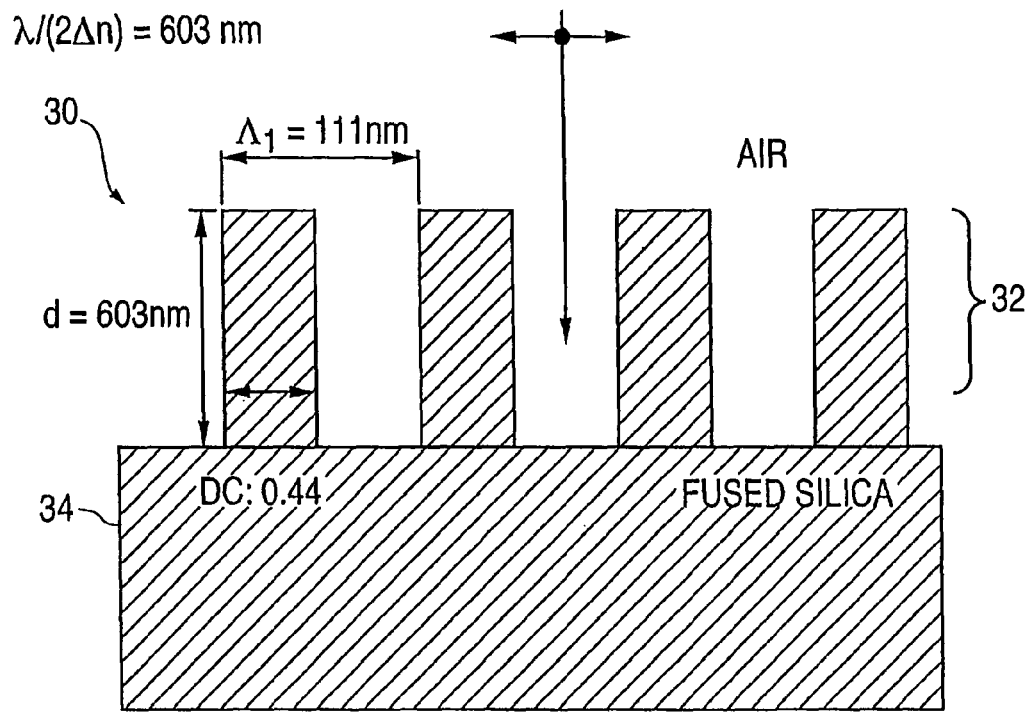
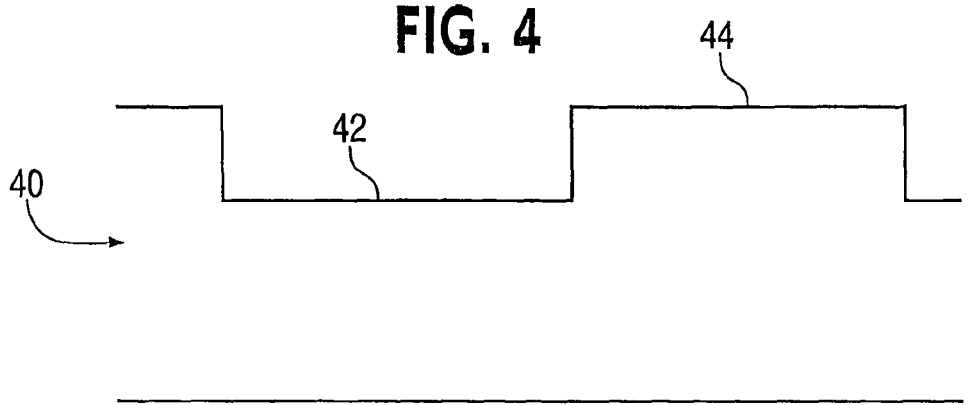

MONOLITHIC POLARIZATION CONTROLLED ANGLE DIFFUSERS, ASSOCIATED METHODS AND LITHOGRAPHIC SYSTEMS INCORPORATING CONTROLLED ANGLE DIFFUSERS

CROSS-REFERENCE TO RELATED APPLICATIONS

This is a continuation-in-part application of PCT Application No. PCT/US2005/030780, filed Aug. 30, 2005, which claims priority under 35 U.S.C. §119(e) to Provisional U.S. Patent Application Ser. No. 60/714,506, filed Aug. 31, 2004.

BACKGROUND OF THE INVENTION

1. Field of the Invention

The present invention is related to a polarization controlled angle diffuser, a method of manufacturing such a polarization controlled angle diffuser, and a lithographic system including a controlled angle diffuser. More particularly, the present invention is related to a monolithic polarization controlled angle diffuser and a method of manufacturing such a polarization controlled angle diffuser.

2. Description of Related Art

Diffusers use diffractive elements to control an angle of illumination in a variety of systems, e.g., in a lithographic system. As a critical dimension in micro-lithography continues to be reduced, the effect of polarization on imaging performance in lithographic systems becomes more influential. If these effects are not accounted for, the imaging enhancement expected from using a higher numerical aperture (N.A.) lens system and/or immersion lithography may not be realized. If the polarization state of illumination could be optimized while controlling the angular distribution of the illumination, the adverse affects of the polarization may be minimized.

One solution involves creating an array of micro-optics, each providing a particular angular distribution, arranged at varying orientations, in combination with an array of polarizers arranged at varying orientations. For example, to create quadrupole illumination where the two poles on the vertical axis have a different polarization state than the two poles on the horizontal axis, the micro-optic array would include dipole micro-optics with every other micro-optic oriented to spread the light vertically. A polarization controlling element, such as a half-wave plate, is then diced into similarly sized portions as each micro-optic to create mini-polarizers. These mini-polarizers are then also arranged in an array. A certain orientation of the mini-polarizers is associated with each particular angular distribution of the micro-optics. For this particular example, each micro-optic providing a dipole along an x-axis could be provided with a mini-polarizer having a vertical polarization and each micro-optic providing a dipole along a y-axis could be provided with a mini-polarizer having a horizontal polarization. Accordingly, a quadrupole illumination profile where the vertical and horizontal dipoles have different polarizations is realized.

However, this solution requires assembly of numerous small pieces, e.g., 2 mm, making the solution difficult to implement. Given the size and the number of the pieces being assembled into two corresponding arrays, the possibility of errors in such arrangement is not negligible. Further, the alignment of the micro-optics and mini-polarizers, both linearly and angularly, would need to be maintained to insure proper correspondence of angular distribution and polarization state. Additionally, the diced parts would have edge chips or bevels that would increase scatter and thus decrease efficiency of the part. Any gaps between the elements of the array could increase the amount of light in the zero order, which is typically to be minimized in illumination systems for lithography.

SUMMARY OF THE INVENTION

It is therefore a feature of the present invention to provide a polarization controlled angle diffuser, a method of manufacturing such a polarization controlled angle diffuser and a lithographic system using a controlled angle diffuser, which substantially overcomes one or more of the problems noted above in connection with the related art.

It is a feature of an embodiment of the present invention to provide a polarization controlled angle diffuser that is monolithic. As used herein, "monolithic" is to mean that the elements of the controlled angle diffuser and the polarization control are each provided on a continuous surface, rather than separating the elements into pieces and then assembling them back together. Thus, while the monolithic polarization controlled angle diffuser of the present invention may be realized on a single surface, it is not to be so limited, and the controlled angle diffuser elements and the polarization elements may be on different surfaces of a substrate or even on different substrates.

It is another feature of an embodiment of the present invention to provide a polarization controlled angle diffuser that maintains its efficiency.

It is yet another feature of an embodiment of the present invention to provide a polarization controlled angle diffuser that minimizes zero order light.

It is still another feature of an embodiment of the present invention to provide a polarization controlled angle diffuser that may readily be interchanged with current diffusers.

It is yet another feature of an embodiment of the present invention to provide a polarization controlled angle diffuser that may easily be manufactured.

It is still another feature of an embodiment of the present invention to provide a controlled angle diffuser in a lithographic system.

At least one of the above and other features and advantages of the present invention may be realized by providing a monolithic polarizing controlled angle diffuser, including a system having at least two parallel, planar surfaces, a controlled angle diffuser pattern for providing an angular distribution at an illumination plane, the controlled angle diffuser pattern being on one of the at least two parallel surfaces, the controlled angle diffuser pattern including at least two controlled angle diffuser elements, each controlled diffuser element outputting different angular distributions, and a polarizing pattern on one of the at least two surfaces, the polarizing pattern including at least two polarizing elements, the at least two polarizing elements outputting polarizations rotated with respect to one another, each of the at least two polarizing elements corresponding to a respective one of the at least two controlled angle diffuser elements.

The system may include a substrate on which the polarizing pattern is formed. At least one of the at least two polarizing elements may be featureless. The polarizations of the at least two polarizing elements may be rotated by 90° with respect to one another.

The polarizing pattern may have a subwavelength structure. The polarizing pattern may have varied etch depths. The etch depth d may be determined by the equation:

$$d = \lambda/2\Delta n$$

where λ is a wavelength at which the diffuser is to be used and Δn is a difference between refractive indices of the substrate for orthogonal polarization states of the polarizing pattern. A period of the polarizing pattern may be selected to maximize Δn.

The substrate on which the polarizing pattern is formed may be birfringent. An etch depth may be determined in accordance with a difference between an ordinary refractive index and an extraordinary refractive index of the substrate. The period of the polarizing pattern may be selected to equal a size of one of the at least two controlled angle diffuser elements.

The controlled angle diffuser elements may be diffractive elements. The controlled angle diffuser elements may on the same substrate as the polarizing elements, either on the same side of the substrate or on opposite sides of the substrate. The controlled angle diffuser pattern may include an alternating array of x dipoles and y dipoles.

At least one of the above and other features and advantages of the present invention may be realized by providing a method of making a monolithic polarizing controlled angle diffuser including creating a controlled angle diffuser design having at least two controlled angle diffuser elements outputting different angular distributions, creating a polarizing pattern having at least two polarizing elements, the at least two polarizing elements outputting polarizations rotated with respect to one another, transferring the controlled angle diffuser design to a surface of a system having at least two surfaces, and transferring the polarizing pattern to one of the at least two surfaces, each of the at least two polarizing elements corresponding to a respective one of the at least two controlled angle diffuser elements.

The transferring the polarizing pattern may include etching a substrate of the system to an etch depth d determined by the equation:

$$d = \lambda/2\Delta n$$

where λ is a wavelength at which the diffuser is to be used and Δn is a different between refractive indices of the substrate for orthogonal polarization states of the polarizing pattern. The period of the polarizing pattern may be selected to maximize Δn.

The transferring the polarizing pattern may include etching a birefringent substrate to an etch depth determined in accordance with a difference between an ordinary refractive index and an extraordinary refractive index of the birefringent substrate. The period of the polarizing elements is selected to equal a size of one of the at least two controlled angle diffuser elements.

The at least two surfaces may be on a single substrate. The polarizing elements and the controlled angle diffuser elements may be on the same side or on opposite sides of the substrate. The transferring of the polarizing pattern may occur before transferring the controlled angle diffuser design.

At least one of the above and other features and advantages of the present invention may be realized by providing a lithographic system, including a light source outputting a beam, and a controlled angle diffuser pattern, the controlled angle diffuser pattern converting the beam into an output beam having a preselected angular energy distribution at a point in a plane of the lithographic system, where the controlled angle diffuser pattern generates the angular energy distribution by having varying spatial frequency structures, where the controlled angle diffuser pattern is divided into a plurality of facet areas, a facet area being defined as a region large enough to contain substantially all of the spatial frequency content of the entire preselected angular energy distribution in the point, and light contributing to the point comes from at least two facet areas of the plurality of facet areas.

The controlled angle diffuser pattern may include at least two controlled angle diffuser elements, each controlled angle diffuser element outputting different angular distributions. The lithographic system may further include a polarizing pattern including at least two polarizing elements, each polarizing element corresponding to a respective controlled angle diffuser element, the at least two polarizing elements outputting polarizations rotated with respect to one another.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 3 illustrates a cross-sectional view of a half wave plate in accordance with an embodiment of the present invention;

FIG. 4 illustrates a schematic cross-sectional view of a half-wave plate in accordance with an embodiment of the present invention;

DETAILED DESCRIPTION OF THE INVENTION

Figure 1:
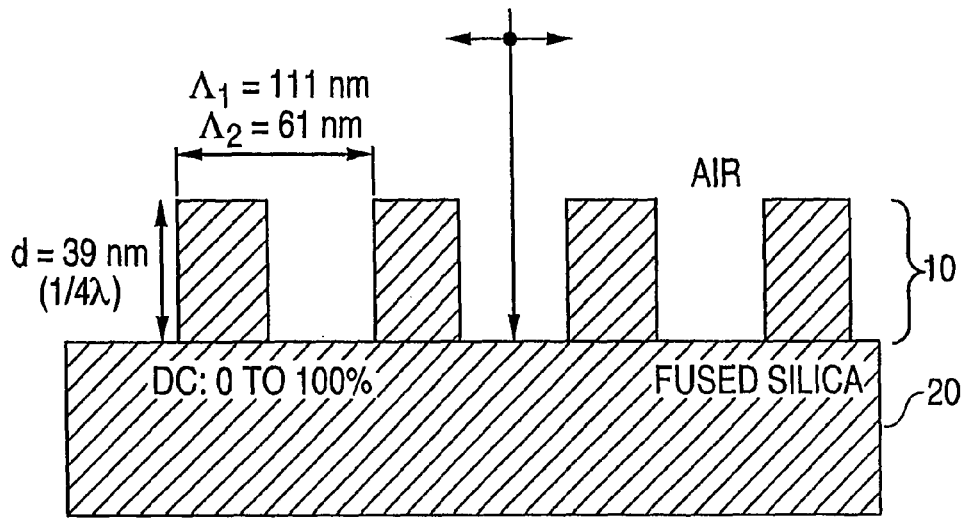
FIG. 1 illustrates a cross-sectional view of a model of a pattern in accordance with an embodiment of the present invention.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. Like reference numerals refer to like elements throughout.

Figure 8:
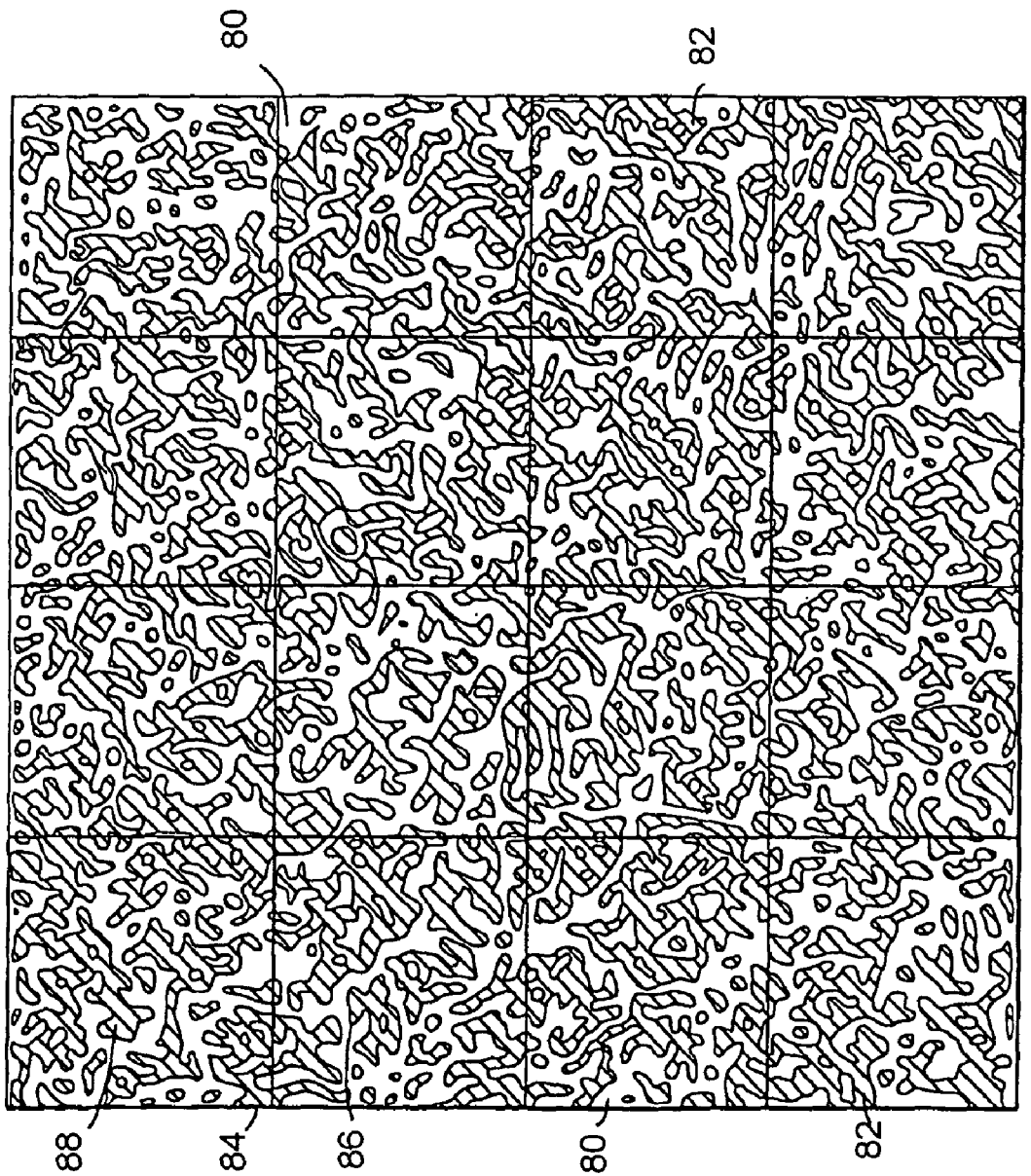
FIG. 8 illustrates a front view of a controlled angle diffuser.

In accordance with the present invention, the polarization of the diffuser may be controlled in accordance with an etch depth of the material. This polarization control pattern may be on the same surface, on an opposite surface of the same substrate or even on different substrates, as the controlled angle diffuser pattern. The surfaces on which the controlled angle diffuser and the polarization pattern are to be formed may be parallel and planar to one another. Examples of appropriate controlled angle diffusers may be found in U.S. Pat. No. 5,850,300, the entire contents of which are herein incorporated by reference for all purposes, and as illustrated in FIG. 8, and discussed in detail below. If the polarization control pattern is on an opposite side of a substrate from the controlled angle diffuser pattern, then front to back alignment will be needed.

Polarization Control

Figure 2:
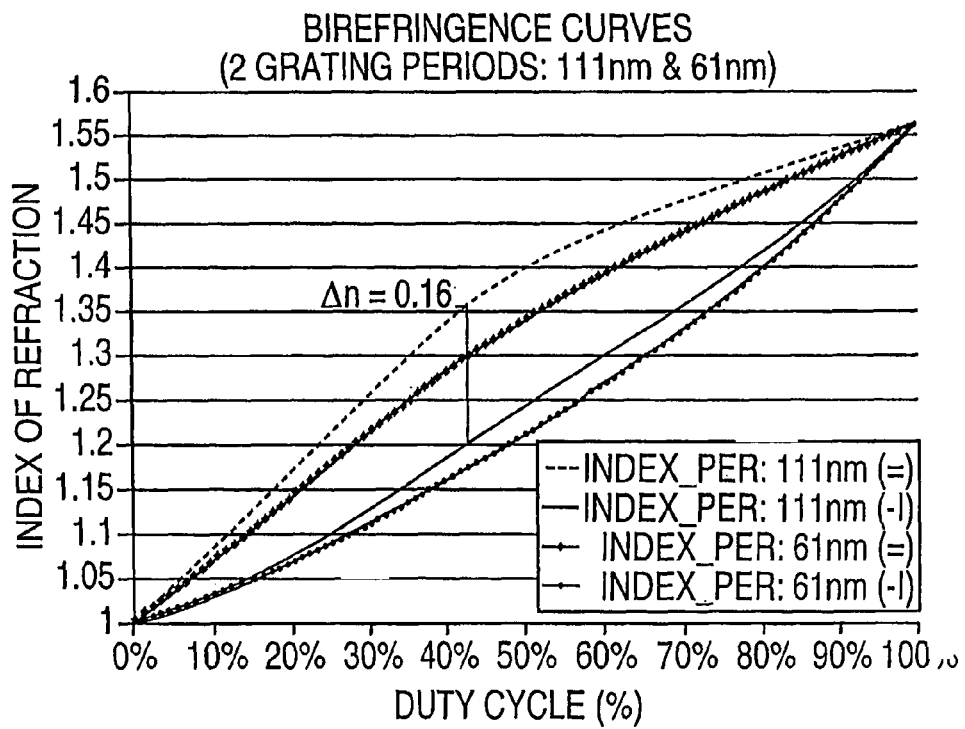
FIG. 2 is a plot of duty cycle versus index of refraction for both polarizations and both grating periods for the model of FIG. 1.

The polarization control may be realized in two manners. First, if the substrate is a non-birefringent material, e.g., fused silica, then a sub-wavelength structure may be designed to change or rotate the polarization state. A model for creating such a structure is shown in FIG. 1. The birefringent curves from this structure are shown in FIG. 2. A structure for a half-wave plate created based on this model is shown in FIG. 3.

In FIG. 1, the reflection of a diffractive pattern 10, here a binary pattern, in a fused silica substrate 20 was modeled for both parallel and perpendicular polarizations. A duty cycle of this pattern was varied from 0 to 100% at 1% increments for both polarizations. A period of this pattern was checked for 0.9 and 0.5 of the wavelength of interested in the substrate material. When the wavelength of interest is in the deep ultraviolet (DUV), e.g., 193 nm, and fused silica, have an index of refraction of about 1.56, is the substrate material, these wavelengths are about 111 nm and 61 nm, respectively. As can be seen from FIG. 2, the greatest birefringence occurs at about a 44% duty cycle using 111 nm as the grating period. Thus, these parameters are selected for creating a half-wave plate 30 shown in FIG. 3. The half-wave plate 30 includes a pattern 32 of depth d, a period of 111 nm and a duty cycle of 44%. For the half-wave plate 30, the depth d is set to be $\lambda/(2\Delta n)$, where $\Delta n$ is the difference in refractive indices for the different polarization states. In fused silica, for the period of 111 nm, this difference is 0.16.

If the material of the substrate is birefringent, e.g., crystal quartz or calcium fluoride (CaF), such patterning is not needed. Instead, this material only needs to be selectively etched for every other part to an appropriate depth to realize the desired polarization rotation. No high resolution patterns are needed, as with the sub-wavelength pattern of the first embodiment. An example of this is shown in FIG. 4, in which a half-wave plate 40 includes etched portions 42 and unetched portions 44 to provide the different rotations. Thus, the unetched portions 44 may be featureless. While no pattern is required, the etch depth to realize the desired rotations are typically an order of magnitude higher than for the patterned approach, e.g., on the order of several microns. The etch depth is determined in accordance with the refractive index difference between the ordinary and extraordinary direction in the birefringent material.

Figure 5:
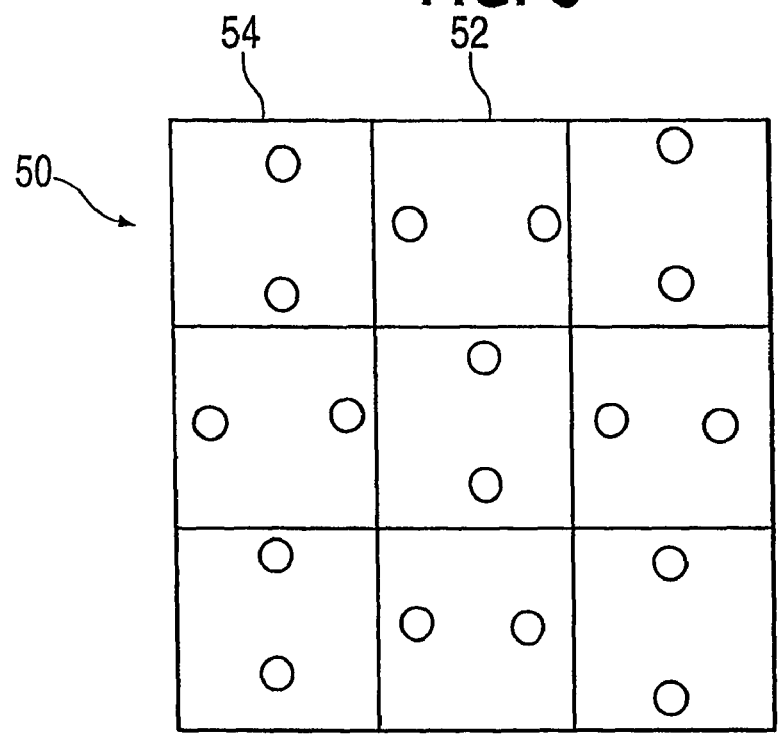
FIG. 5 illustrates a schematic top view of outputs of individual portions of an example of a controlled angle diffuser pattern.

As a specific example, polarized quadrupole illumination may be realized in accordance with an embodiment of the present invention. First, a dipole illuminator would be designed. Such a dipole illuminator may be designed using a diffractive approach, as set forth in U.S. Pat. No. 5,850,300. As shown in FIG. 5, an output of each cell of an array of cells 50 includes a plurality of x dipole illumination cells 52, which are oriented along the x-axis, and a plurality of y dipole illumination cells 54, which are oriented along the y-axis. These x dipole illumination cells 52 and y dipole illumination cells 54 are arranged in a two-dimensional array of alternating x and y orientations.

If the substrate is not a birefringent material, and the input light is to be polarized, then a polarizing pattern rotating the polarization may be provided for every other illumination cell, i.e., all dipole illumination cells of the same orientation. The polarizing pattern would be created using the design technique of FIG. 3 and then transferred to a surface and aligned with the controlled angle diffuser pattern. Of course, if the incoming light is not polarized, the polarizing pattern may include a polarization element for each dipole illumination cell. If the substrate is birefringent, every other illumination cell, i.e., all dipole illumination cells of the same orientation, would have an etched portion as taught in connection with FIG. 4.

Figure 6:
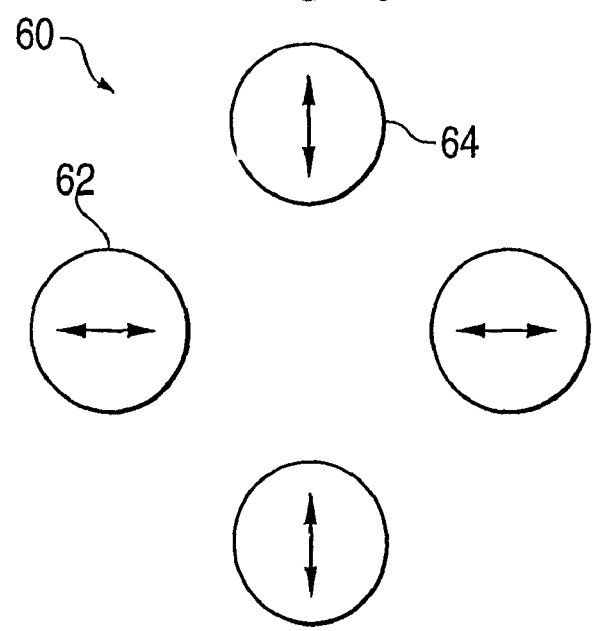
FIG. 6 illustrates an output of the controlled angle diffuser pattern of FIG. 5 in conjunction with a polarizing pattern of an embodiment of the present invention.

The composite output of a substrate having this controlled angle diffuser pattern therein would be a quadrupole 60 as shown in FIG. 6, without the arrows indicating polarization orientation in the quadrupole 60. In the particular example shown in FIG. 6, the polarization is rotated by 90° in the quadrupole 60. An x dipole illumination 62 and a y dipole illumination 64 have orthogonal polarizations, as indicated by the arrows therein.

Figure 7:
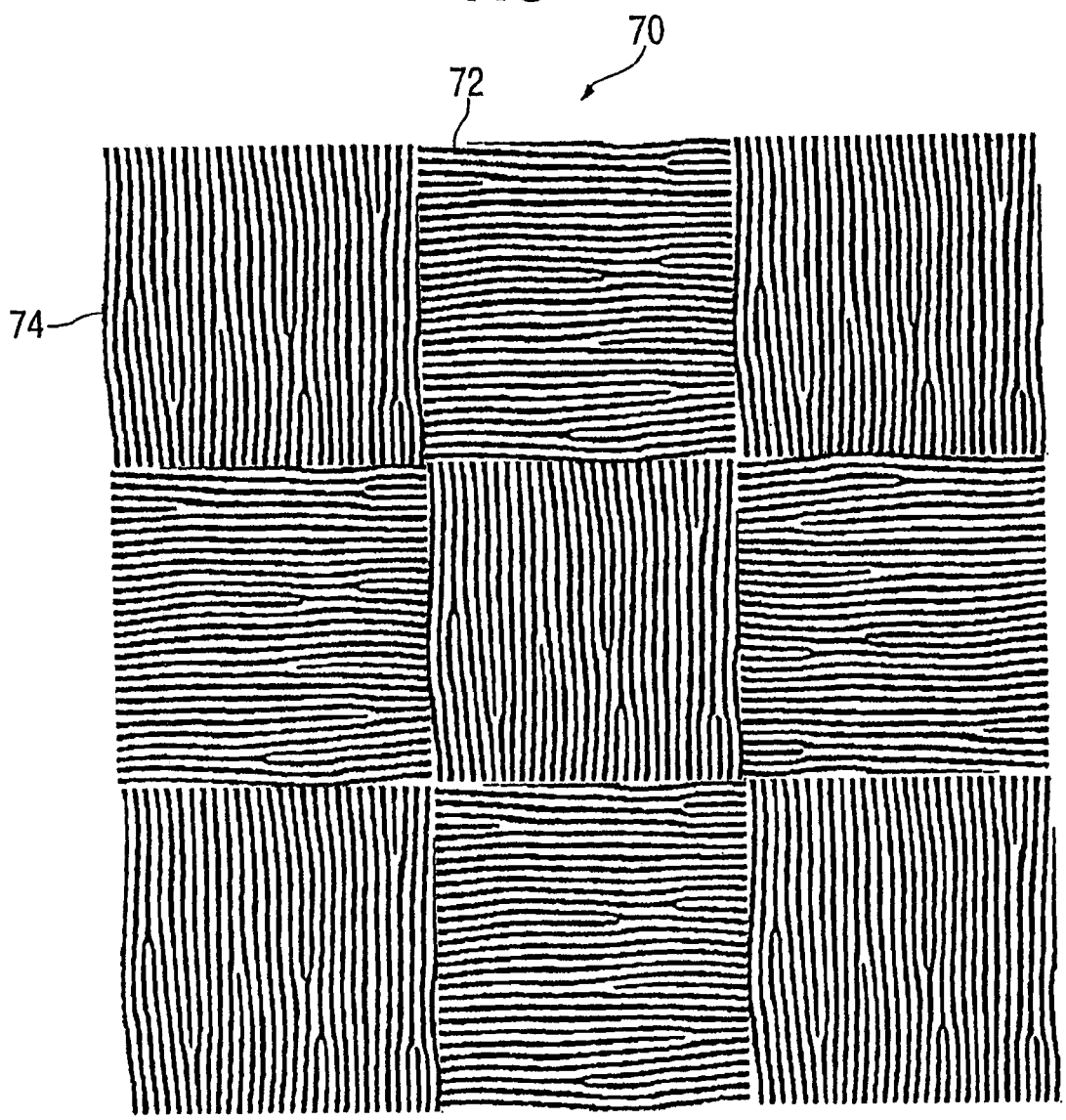
FIG. 7 illustrates a top view of the controlled angle diffuser pattern providing the outputs of FIG. 5.

An example of an actual mask 70 used to create the illumination shown in FIGS. 5 and 6 is illustrated in FIG. 7. Here, the mask 70 includes a plurality of x dipole illuminators 72, which are oriented along the x-axis, and a plurality of y dipole illuminators 74, which are oriented along the y-axis. Each dipole illuminator 72, 74 of this array would have the desired dimensions of the conventional individual elements, e.g., about 2 mm.

The controlled angle diffuser pattern of the mask 70 may then be transferred to a substrate, e.g., by lithography or replication, followed by etching. The polarization pattern in accordance with either embodiment of the present invention may be transferred to either the same or the opposite surface of the substrate, e.g., by lithography or replication, followed by etching. Alternatively, the transfer of the polarizing pattern may be transferred to another substrate. These substrates may be secured together. This securing may occur on a wafer level, after which the secured wafers may be vertically separated to form dies including at least two controlled angle diffuser elements and at least two polarizing elements. Each of the two controlled diffuser elements may output different angular distributions. Each polarizing element may correspond to a respective controlled angle diffuser element. Each of the two polarizing elements may output polarizations rotated with respect to one another.

Controlled Angle Diffuser

A front view of an exemplary embodiment of a controlled angle diffuser 84 is shown in FIG. 8. The controlled angle diffuser 84 of FIG. 8 may have been arbitrarily designated to have an array of facet areas, or facets, 86, arranged in a 4×4 array as shown by dotted lines in FIG. 8. These dotted lines are not structure on the controlled angle diffuser, but are used to designate a facet area or a facet, which is a convenient way to refer to an area of the controlled angle diffuser 84. Each facet area 86 has irregularly patterned plateaus 80 and vias 82. No sharp edges or breaks appear between facet areas 86.

Facet area, for purposes of the description, refers to an area of arbitrarily designated size on the controlled angle diffuser 84. It is used as a convenient way to refer to an area of irregularly shaped or patterned diffractive fringes 88 (irregularly shaped or patterned plateaus and vias in this exemplary embodiment) on the controlled angle diffuser. A controlled angle diffuser has at least two facet areas. In the exemplary embodiment, no two facet areas 86 contain a pattern of plateaus 80 and vias 82 that are alike. The pattern within one facet area 86 is nominally correlated to itself and nominally uncorrelated to the pattern in all other facet areas. Therefore, each facet area 86 within the controlled angle diffuser 84 may direct light to an entire target area of an output plane.

When an incident optical beam, e.g., a collimated beam, illuminates the facet areas, or facets, 86 of the controlled angle diffuser 84, the irregularly patterned plateaus 80 and vias 82 provide no regular, undesired structure to transmit regular, undesired intensity variation (not shown) in the output plane. An additional advantage of the present embodiment is that departing from designing each individual facet 86 to designing facet areas or entire holograms provides greater freedom of design that allows the designer to reduce undesired intensity variation in the output plane by making adjustments to the plateaus 80 and vias 82, as sharp breaks or edges provide much less design freedom in relation to those sharp breaks or edges. Further, by designing facet areas or entire holograms provides greater freedom of design that allows greater freedom to create output beams of arbitrary shapes, such as rings and cross-hairs.

In the embodiment shown in FIG. 8, when an input beam illuminates the facet area 86, and the facet area 86 transmits a beam having a preselected angular spread in the output plane. Those of ordinary skill in the art of this invention are familiar with angular spread. Angular spread, or angular divergence, is the increase in nominal beam size over a finite propagation distance expressed as an angle in radians or degrees. In any given facet area 86, the plateaus 80 and vias 82 diffract the input beam such that transmitted portions of the beam have a preselected angular spread. The angular spread provided by a facet area 86 is selected by the designer of the controlled angle diffuser 84 such that a desired output beam may illumiante the output plane. The designer may preselect an angular spread of from e.g., about ±0° to about ±90°.

The choice of angular spread depends upon the application for which the controlled angle diffuser is used and the desired output beam. The angular spread is selected by the designer as needed for the application at hand. For example, an illumination system for machine vision may require uniform illumination across a 10°×15° degree rectangular area. The designer would chose angular spread for the controlled angle diffuser to obtain such a desired illumination.

With a facet area 86 that transmits a beam with a predesigned angular spread, the designer can control the angle over which the transmitted light is spread. The facet areas 86 of the controlled angle diffuser 84 may provide angular spread such that the target area illuminated on the output plane is larger than the illuminated facet areas 86.

The controlled angle diffuser 84 may also homogenize spatial power over a preselected target area. That is, a constant, preselected power distribution at the output plane may be provided even if the power distribution of a beam incident upon the surface of the controlled angle diffuser 84 deviates from design parameters.

The designer can choose any particular shape for the target area. The designer may design the plateaus 80 and vias 82 such that a target pattern of a desired shape may be projected upon the output plane from the controlled angle diffuser 84. The spatial frequency content of the hologram is designed to produce a desired pattern. That is, the size and orientation of the plateaus 80 and vias 82 are designed to produce a desired pattern. Preferably, the design takes place using a computer.

By transmitting light at various, predetermined angular spreads, the facet areas 86 of the controlled angle diffuser 84 project spatial power in predetermined target patterns onto the output plane. Essentially, a target pattern may be composed of illuminated areas of the output plane adjacent to non-illuminated areas of the output plane. The controlled angle diffuser 54 may be designed such that substantially all of the spatial energy is transmitted to predetermined target areas of the output plane and relatively no spatial energy is transmitted to other predetermined areas of the output plane, thus projecting a predetermined target pattern onto the output plane.

Figure 9:
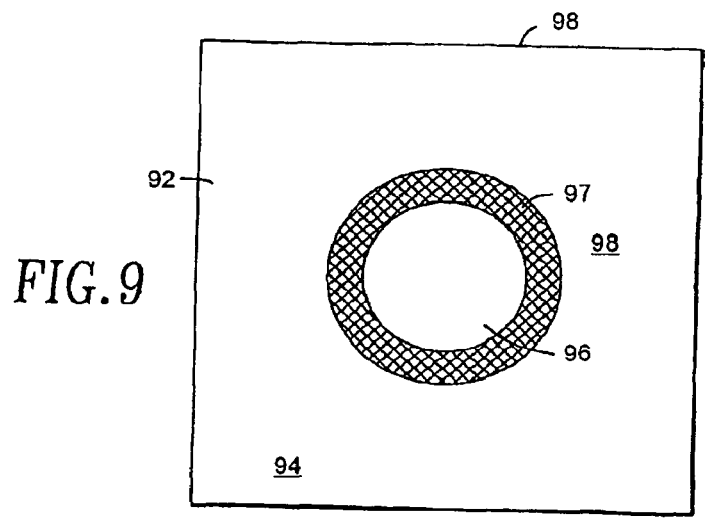
FIG. 9 illustrates an annular target pattern.

The target pattern formed by the controlled angle diffuser 84 in FIG. 8 is a circular pattern. Other patterns, such as the one shown in FIG. 9, may be selected by the designer of the controlled angle diffuser 84. FIG. 9 illustrates an annular target pattern 92 at an output plane 94. That is, FIG. 9 illustrates a preselected power distribution pattern in which the spatial power is distributed at the output plane 98 such that a relatively non-illuminated circular area 96 is surrounded by a ring of illuminated area 97, which is in turn adjacent to a relatively non-illuminated area 98. Non-circular patterns, such as the shape of a flower or rectangle, may also be chosen.

Use in a Lithographic System

Any of the embodiments of the present invention may be particularly useful for in lithographic systems, e.g., photolithographic exposure systems, which may be used to image a pattern of a mask onto a wafer to expose resist on the wafer in a pre-determined pattern. Subsequent processing of the wafer results in the completion of layers that eventually form the desired device, such as an integrated circuit.

When the mask is used in a projection lithography system, such as a laser stepper with a 5:1 or 10:1 reduction ratio, the mask is often referred to as a reticle. The reticle or mask is typically formed by chrome regions on a transparent substrate. The chrome regions of the mask block the incident light, thereby imposing the pattern of the mask as an intensity variation on the light. In a 5× laser stepper, the pattern of the reticle is reduced by a factor of 5 as imaged onto a wafer. Typically, in this application, the beam illuminating the diffractive is relatively uniform and has a rather narrow cone angle of divergence, i.e., limited spatial and angular energy distributions.

Embodiments of the present invention allow for the control of the angular distribution of the light on the wafer. By modifying the particular angular distribution of the light illuminating the wafer, the depth of the field and resolving power of photolithographic exposure systems may be extended. Additionally, when any of the embodiments of the present invention also homogenize the beam, the system may be relatively insensitive to fluctuations in positioning of the incident beam and to fluctuations in the spatial energy distributions of the incident beam. Further, a polarization state may be optimized.

By using embodiments of the present invention, the intensity, angular frequency content, pupil pattern shape, and polarization of the exposure light used in photolithography can be controlled. Such control can improve the resolution of the image of the master pattern on the integrated circuit wafer. It has been found that for some master patterns, it is better for the light to illuminate at certain angles, ranges of angles or polarizations. The controlled angle diffuser according to embodiments of the present invention may provide light at that angle while homogenizing the spatial energy provided, as well as providing control of other attributes of the exposure light. Such control may improve yields in semiconductor chip manufacturing and other areas in which photolithography is used.

Figure 10:
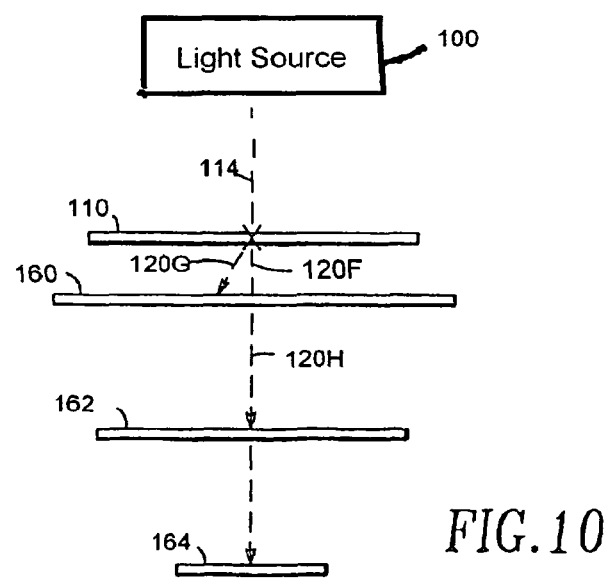
FIG. 10 illustrates a side view of a lithographic system in which a controlled angle diffuser in accordance with any of the embodiment of the present invention may be used.

For example, referring to FIG. 10, a light source 100 may illuminate a controlled angle diffuser 110 (shown in side view) of any of the embodiments of the present invention, with or without polarization control, with a collimated input beam 114. The controlled angle diffuser 110 may transmit a majority portion of the incident light to a mask 160 at a desired angular spread, and with a preselected intensity and spatial power distribution, wherein the preselected spatial power distribution is uniform. This transmitted portion 120f, 120g may serve as the exposure light. The mask 160 may be placed close to the controlled angle diffuser 110 such that there is no appreciable change in power distribution between the controlled angle diffuser 110 and the mask 160, and thus, the beam may be uniform at both the controlled angle diffuser 110 and the mask 160. The mask 160 may be illuminated with the desired exposure light 120f, 120g.

The portion of the exposure light 120f, 120g that is not blocked 120h by the mask 160 may be transmitted by the master 160, and may illuminate a lens 162. This portion 20h may have the desired, preselected angular spread. The lens 162 in turn transmits the incident light 120h such that the mask 160 is imaged onto a mount 164 for receiving a subject wafer having, e.g., photoresist (not shown) thereon. The lens 162 provides a desired reduction factor. This embodiment images the mask 160 onto the subject wafer on the mount 164 in a desired manner, particularly a desired angular spread. Thus, the wafer on the mount 164 may be exposed in the preselected, desired manner with an exposure light with desired and optimized attributes, and a copy may be provided.

In this manner, by optimizing the exposure light as desired and needed, higher yields during, for example, semi-conductor chip manufacturing may be realized. The controlled angle diffuser 110 may be used to, e.g., block zero to two degrees, allow two to four degrees, and block from four degrees onward. Further, for example, the controlled angle diffuser may form a top-hat, e.g., from plus three degrees to minus three degrees. Control of the angular spread and the frequency content, and the polarization of the transmitted light may be realized by the design of the controlled angle diffuser 110, preferably using a computer.

The controlled angle diffuser 110 may also be used in other parts of the lithographic system, and may be designed accordingly.

Exemplary embodiments of the present invention have been disclosed herein and, although specific terms are employed, they are used and are to be interpreted in a generic and descriptive sense only and not for purpose of limitation. For example, the polarizing pattern could be transferred to the substrate before the controlled angle diffuser pattern. Accordingly, it will be understood by those of ordinary skill in the art that various changes in form and details may be made without departing from the spirit and scope of the present invention as set forth in the following claims.

What is claimed is:

1. A monolithic polarizing controlled angle diffuser, comprising:
   a system having at least two parallel, continuous planar surfaces:
   a controlled angle diffuser pattern for providing an angular distribution at an illumination plane, the controlled angle diffuser pattern being on one of the at least two parallel continuous surfaces, the controlled angle diffuser pattern including at least two controlled angle diffuser elements integral with the one of the at least two continuous surfaces, each controlled diffuser element outputting different angular distributions, the at least two controlled angle diffuser elements defining a monolithic controlled angle diffuser pattern; and
   a polarizing pattern on one of the at least two parallel continuous surfaces, the polarizing pattern including at least two polarizing elements, each polarizing element corresponding to a respective controlled angle diffuser element, the at least two polarizing elements outputting polarizations rotated with respect to one another, the at least two polarizing elements defining a monolithic polarizing pattern.

2. The monolithic polarizing controlled angle diffuser as claimed in claim 1, wherein the system comprises a substrate on which the monolithic polarizing pattern is formed.

3. The monolithic polarizing controlled angle diffuser as claimed in claim 2, wherein the monolithic polarizing pattern comprises a subwavelength structure.

4. The monolithic polarizing controlled angle diffuser as claimed in claim 2, wherein an etch depth d is determined by the equation:

$$d = \lambda/2\Delta n$$

where $\lambda$ is a wavelength at which the diffuser is to be used and $\Delta n$ is a difference between refractive indices of the substrate for orthogonal polarization states of the monolithic polarizing pattern.

5. The monolithic polarizing controlled angle diffuser as claimed in claim 4, wherein a period of the monolithic polarizing pattern is selected to maximize $\Delta n$.

6. The monolithic polarizing controlled angle diffuser as claimed in claim 2, wherein the substrate is birefringent.

7. The monolithic polarizing controlled angle diffuser as claimed in claim 6, wherein the monolithic polarizing pattern is etched into a surface of the substrate, the monolithic polarizing pattern having an etch depth determined in accordance with a difference between an ordinary refractive index and an extraordinary refractive index of the substrate.

8. The monolithic polarizing controlled angle diffuser as claimed in claim 7, wherein a period of the monolithic polarizing pattern is selected to equal a size of one of the at least two controlled angle diffuser elements.

9. The monolithic polarizing controlled angle diffuser as claimed in claim 2, wherein a first surface of the substrate serves as the one of the at least two continuous surfaces with which the controlled angle diffuser elements are integral.

10. The monolithic polarizing controlled angle diffuser as claimed in claim 9, wherein the monolithic polarizing pattern and the controlled angle diffuser elements are integral with the first surface of the substrate.

11. The monolithic polarizing controlled angle diffuser as claimed in claim 9, wherein the monolithic polarizing pattern is integral with a second surface, different from the first surface, of the substrate.

12. The monolithic polarizing controlled angle diffuser as claimed in claim 1, wherein controlled angle diffuser elements are diffractive elements.

13. The monolithic polarizing controlled angle diffuser as claimed in claim 1, wherein at least one of the at least two polarizing elements is featureless.

14. The monolithic polarizing controlled angle diffuser as claimed in claim 1, wherein the polarizations of the at least two polarizing elements are rotated by 90° with respect to one another.

15. The monolithic polarizing controlled angle diffuser as claimed in claim 1, wherein the monolithic controlled angle diffuser pattern comprises an alternating array of x dipoles and y dipoles.

16. The monolithic polarizing controlled angle diffuser as claimed in claim 1, wherein the at least two polarizing elements of the monolithic polarizing pattern are integral with one of the at least two continuous surfaces.

17. A method of making a monolithic polarizing controlled angle diffuser comprising:
   creating a controlled angle diffuser design having at least two controlled angle diffuser elements outputting different angular distributions;
   creating a polarizing pattern having at least two polarizing elements, the at least two polarizing elements outputting polarizations rotated with respect to one another;
   transferring the controlled angle diffuser design to a surface of a system having at least two continuous surfaces to form a controlled angle diffuser pattern having at least two controlled angle diffuser elements integral with one of the at least two continuous surfaces, the at least two controlled angle diffuser elements defining a monolithic controlled angle diffuser pattern; and transferring the polarizing pattern to one of the at least two continuous surfaces, each of the at least two polarizing elements corresponding to a respective one of the at least two controlled angle diffuser elements, the at least two controlled polarizing elements defining a monolithic polarizing pattern.

18. The method as claimed in claim 17, wherein transferring the monolithic polarizing pattern includes etching a substrate of the system to an etch depth d determined by the equation:

$$d = \lambda/2\Delta n$$

where $\lambda$ is a wavelength at which the diffuser is to be used and $\Delta n$ is a different between refractive indices of the substrate for orthogonal polarization states of the monolithic polarizing pattern.

19. The method as claimed in claim 18, further comprising selecting a period of the monolithic polarizing pattern to maximize $\Delta n$.

20. The method as claimed in claim 17, wherein transferring the monolithic polarizing pattern includes etching a birefringent substrate to an etch depth determined in accordance with a difference between an ordinary refractive index and an extraordinary refractive index of the birefringent substrate.

21. The method as claimed in claim 20, wherein a period of the polarizing elements is selected to equal a size of one of the at least two controlled angle diffuser elements.

22. The method as claimed in claim 17, wherein the at least two surfaces are on a substrate.

23. The method as claimed in claim 22, wherein transferring the polarizing elements and the controlled angle diffuser elements occur on a same side of the substrate.

24. The method as claimed in claim 22, wherein transferring the polarizing elements and the controlled angle diffuser elements occur on different sides of the substrate.

25. The method as claimed in claim 22, wherein transferring the monolithic polarizing pattern occurs before transferring the controlled angle diffuser design.

26. The method as claimed in claim 17, wherein transferring the monolithic polarizing pattern to one of the at least two continuous surfaces includes forming at least two polarizing elements integral with one of the at least two continuous surfaces.

27. A lithographic system, comprising;

a light source outputting a beam;

a controlled angle diffuser pattern, the controlled angle diffuser pattern converting the beam into an output beam having a preselected angular energy distribution at a point in a plane of the lithographic system, where the controlled angle diffuser pattern generates the angular energy distribution by having varying spatial frequency structures, where the controlled angle diffuser pattern is divided into a plurality of facet areas, a facet area being defined as a region large enough to contain substantially all of the spatial frequency content of the entire preselected angular energy distribution in the point, and light contributing to the point comes from at least two facet areas of the plurality of facet areas, wherein the controlled angle diffuser pattern includes at least two controlled angle diffuser elements, each controlled angle diffuser element outputting different angular distributions, the at least two controlled angle diffuser elements defining a monolithic controlled angle diffuser pattern; and a polarizing pattern including at least two polarizing elements, each polarizing element corresponding to a respective controlled angle diffuser element, the polarization pattern being on and integral with a continuous surface, the at least two polarizing elements outputting polarizations rotated with respect to one another, the at least two polarizing elements defining a monolithic polarizing pattern.

* * * * *

UNITED STATES PATENT AND TRADEMARK OFFICE
CERTIFICATE OF CORRECTION

| | | |
|---|---|---|
| PATENT NO. | : 7,916,390 B2 | Page 1 of 1 |
| APPLICATION NO. | : 11/711854 | |
| DATED | : March 29, 2011 | |
| INVENTOR(S) | : Marc D. Himel and Alan D. Kathman | |

It is certified that error appears in the above-identified patent and that said Letters Patent is hereby corrected as shown below:

On the Title Page, item (73) should read:

-- (73) Assignee: Tessera North America, Inc. --

Signed and Sealed this
Eleventh Day of February, 2014

Michelle K. Lee
*Deputy Director of the United States Patent and Trademark Office*